US009775252B2

(12) United States Patent
Pinto, IV et al.

(10) Patent No.: US 9,775,252 B2
(45) Date of Patent: Sep. 26, 2017

(54) METHOD FOR SOLDERING SHAPE MEMORY ALLOYS

(71) Applicant: GM GLOBAL TECHNOLOGY OPERATIONS LLC, Detroit, MI (US)

(72) Inventors: Nicholas W Pinto, IV, Shelby Township, MI (US); Nancy L. Johnson, Northville, MI (US); Nicholas P. Irish, Commerce, MI (US); Michael P. Balogh, Novi, MI (US); Daad B Haddad, Sterling Heights, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 58 days.

(21) Appl. No.: 14/931,056

(22) Filed: Nov. 3, 2015

(65) Prior Publication Data

US 2017/0127532 A1  May 4, 2017

(51) Int. Cl.
*B23K 1/19* (2006.01)
*H05K 3/34* (2006.01)
*B23K 1/20* (2006.01)
*B23K 35/36* (2006.01)
*B23K 35/362* (2006.01)

(52) U.S. Cl.
CPC ............ *H05K 3/3489* (2013.01); *B23K 1/19* (2013.01); *B23K 1/203* (2013.01); *B23K 35/362* (2013.01); *B23K 35/3605* (2013.01); *H05K 3/3457* (2013.01)

(58) Field of Classification Search
None
See application file for complete search history.

(56) References Cited

U.S. PATENT DOCUMENTS

| 2,761,792 A | * | 9/1956 | Wasserman | B23K 35/002 148/26 |
| 4,415,116 A | * | 11/1983 | Norton | B23K 3/02 219/230 |
| 4,648,180 A | * | 3/1987 | Holt | H05K 3/222 174/251 |

(Continued)

FOREIGN PATENT DOCUMENTS

| CN | 104175026 A | * | 12/2014 |
| JP | 59200600 A | * | 11/1984 |

(Continued)

*Primary Examiner* — Devang R Patel
(74) *Attorney, Agent, or Firm* — Quinn IP Law

(57) ABSTRACT

A method of soldering a shape memory alloy (SMA) element to a component includes positioning a tinned end of the SMA element with respect to a surface of the component, and then directly soldering the tinned end to the surface using solder material having a low liquidus temperature of 500° F. or less when an oxide layer is not present on the SMA element. The end may be soldered using lead-based solder material at a higher temperature when an oxide layer is present. The end may be tinned with flux material containing phosphoric acid or tin fluoride prior to soldering the SMA element. The SMA element may be submersed in an acid bath to remove the oxide layer. The solder material may contain tin and silver, antimony, or zinc, or other materials sufficient for achieving the low liquidus temperature. Heat penetrating the SMA element is controlled to protect shape memory abilities.

19 Claims, 1 Drawing Sheet

(56) References Cited

U.S. PATENT DOCUMENTS

| | | | | | |
|---|---|---|---|---|---|
| 5,035,837 | A | * | 7/1991 | Saeki | B22F 1/0059 106/1.13 |
| 5,145,722 | A | * | 9/1992 | Kaspaul | B23K 35/3612 148/23 |
| 5,242,759 | A | * | 9/1993 | Hall | B23K 35/004 228/207 |
| 5,695,111 | A | * | 12/1997 | Nanis | A61L 31/022 228/206 |
| 8,021,311 | B2 | * | 9/2011 | Munoz | A61M 25/0009 600/585 |
| 2005/0072837 | A1 | * | 4/2005 | Nanis | B23K 35/3602 228/207 |
| 2013/0199172 | A1 | * | 8/2013 | Strom | F03G 7/065 60/527 |

FOREIGN PATENT DOCUMENTS

| | | | | |
|---|---|---|---|---|
| JP | 2008038802 | A | * | 2/2008 |
| KR | 20100065483 | A | * | 6/2010 |

* cited by examiner

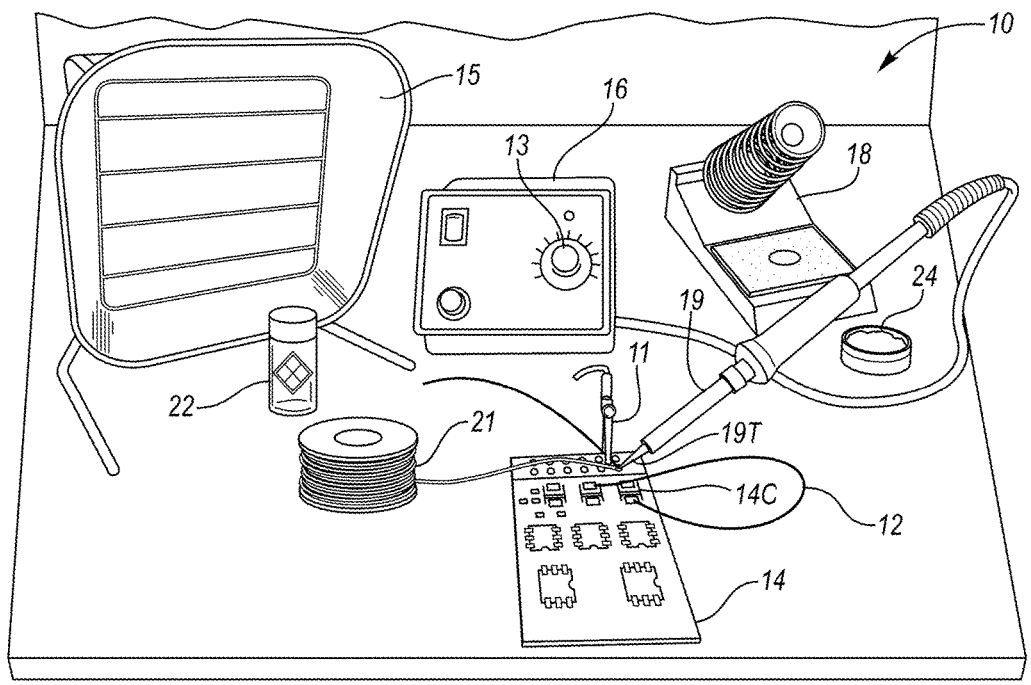
FIG. 1
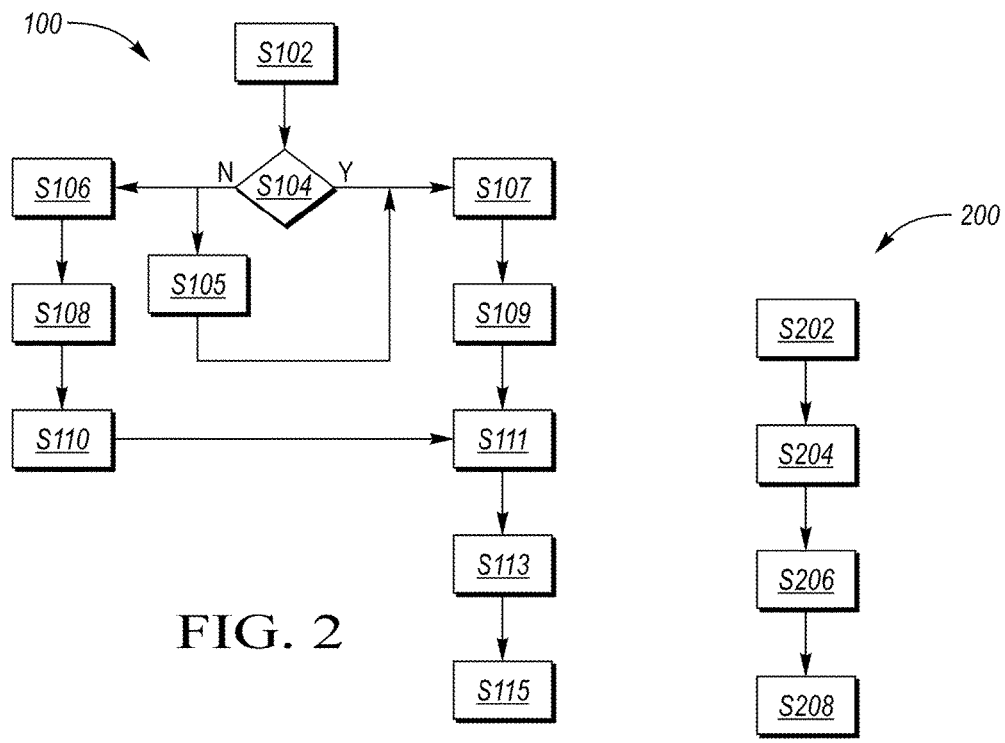
FIG. 2
FIG. 3

METHOD FOR SOLDERING SHAPE MEMORY ALLOYS

TECHNICAL FIELD

The present disclosure relates to a method for soldering shape memory alloys.

BACKGROUND

Shape memory alloys (SMA) are a class of materials exhibiting pseudo-elasticity and shape memory. Deformation of an SMA element such as an SMA wire is temporary and reversible by application of an external stimulus such as heat or an electrical signal. Shape memory capabilities of an SMA element are due in large part to a temperature- and stress-dependent solid-state change of phase that occurs due to a cooperative atomic rearrangement.

Certain mechatronic applications use SMA elements to carry and transmit a load and/or a displacement, for example SMA wire-based control actuators. However, solder materials of the types conventionally used to join conductive wires in electronic devices do not bond well to SMA materials such as nickel-titanium. Therefore, current practices for joining SMA elements to a component include crimping a metal end attachment onto the distal ends of the SMA element and then fastening the crimped end attachment to a surface of the component. However, the crimping of an SMA element has certain performance limitations, including potential slippage or fatigue over time at or adjacent to the crimped end attachments.

SUMMARY

A method of soldering a shape memory alloy (SMA) element to a component is disclosed herein. The method, including specific steps for protecting the critical shape memory properties of the SMA element, enables direct soldering an end of a SMA element, e.g., an SMA wire, to a component. For instance, the SMA element may be soldered directly to a contact pad of a surface mount or through-hole of a printed circuit board assembly, or directly to other SMA elements. The present approach is intended to help address the manufacturing problem in which conventional solder and flux combinations do not bond well to the materials of construction of typical SMA elements, e.g., nickel-titanium (NiTi). The method disclosed herein, which enables direct soldering of the SMA element without the use of conventional end crimps or other intervening structure between the SMA element and the surface to which the SMA element is soldered, is specifically intended to minimally impact the shape memory capabilities of the SMA element.

In a particular embodiment, a method of soldering an SMA element to a component includes tinning an end of the SMA element with a predetermined flux material and solder material, positioning the tinned end of the SMA element with respect to a surface of the component, and directly soldering the tinned end of the SMA element to the surface of the component. When the SMA element does not have an oxide layer, the solder material has a liquidus temperature that does not exceed 500° F. Higher temperatures may be used when an oxide layer is present, and the solder material may be leaded in those instances. The solder material in an example embodiment may be tin-based, although other materials may be used within the intended inventive scope, including lower percentage mixtures of tin and lead, or mixtures of indium with lead, silver, or tin, with various other example material combinations set forth below. The method includes controlling an amount of heat penetrating into a depth of the SMA element while tinning and directly soldering the SMA element to thereby protect shape memory abilities of the SMA element.

The method may include soldering the tinned end of the SMA element to the surface of the component using a lead-free solder material when the oxide layer is not present.

The method may optionally include submersing the SMA element in an acid bath for a calibrated duration sufficient for producing a clean SMA element. The bath may be a mixture of hydrofluoric acid and nitric acid. The bathed SMA element may be rinsed in a water bath to remove any acid residue.

In various non-limiting example embodiments, the solder material may contains at least 3.5% elemental silver by weight, e.g., KAPP ZAPP 3.5, or 5% elemental antimony by weight, or 9% to 15% zinc by weight. Other materials may be used to achieve the required liquidus temperature.

The SMA element may be constructed of nickel titanium and may be configured as an SMA wire in some embodiments.

The above features and advantages and other features and advantages of the present disclosure are readily apparent from the following detailed description of the best modes for carrying out the disclosure when taken in connection with the accompanying drawings.

BRIEF DESCRIPTION OF THE DRAWINGS

FIG. 1 is a schematic illustration of an example soldering station for the soldering of shape memory alloy (SMA) elements to a component in accordance with a disclosed method.

FIG. 2 is a flow chart describing an example method for soldering SMA elements to a component.

FIG. 3 is a flow chart describing an automated version of the method for soldering SMA elements to a component.

DETAILED DESCRIPTION

Referring to the drawings, wherein like reference numbers correspond to like or similar components throughout the several figures, an example soldering station 10 is shown schematically in FIG. 1. As described below with reference to FIG. 3, however, the disclosure is not limited to manual processes. The soldering station 10 of FIG. 1 is configured for soldering a shape memory alloy (SMA) element 12 to a surface of a component 14. For instance, the soldering station 10 may be used to solder the SMA element 12 to a contact pad 14C, e.g., an electrical contact or actuator surface of an example printed circuit board assembly as shown. Useful applications of SMA materials extend well beyond the realm of electronics, as is well known in the art, and therefore the printed circuit board assembly is merely illustrative. The component 14 may be optionally embodied as a control board, with the SMA element 12 selectively connected to apply a force or a load to the control board, again without being limited to such an application.

The soldering station 10 of FIG. 1 includes a controller 16 in communication with a soldering iron 18 having a thermally-controlled soldering pencil 19. A clip-on style heat sink 11 may be used to secure the SMA element 12, as well as to act as a heat sink as set forth below. A fume hood 15 may also be used to help remove fumes that may be generated by the soldering process in the vicinity of the operator. Also arranged at the soldering station 10 are required materials and equipment as set forth below, which are required for successfully soldering the SMA element 12 according to a method 100 shown in FIG. 2. The required materials include solder material 21 and the flux material 22 of the specific compositions described below. Conventional tip-tinning material 24 may be used to help clean oxides and dirt from the soldering pencil 19 prior to the soldering operation.

As noted above, conventional soldering materials are largely or wholly ineffective when applied to SMA materials, particularly nickel-titanium SMA wires. Therefore, the specific material compositions, welding temperatures, and techniques disclosed herein are intended to enable the direct soldering of SMA elements 12 to the component 14. As used herein, the terms "direct" and "directly" require the absence of intervening structure between the SMA element 12 and the surface to which the SMA wire 12 is to be soldered. By way of example, conventional approaches include crimping a metallic end piece to an end of an SMA wire, then soldering or fastening the metallic end piece to a surface. Such a process is considered to be indirect, as the material of the SMA wire itself is not soldered to the surface.

SMA wires and other SMA elements 12, when manufactured, have the ability to shrink at a calibrated activation temperature, e.g., by up to 6% in length, thus allowing the SMA element 12 to be used as an actuator. If the SMA element 12 is overheated during the soldering process, which could occur using conventional soldering techniques, the shape memory abilities of the SMA element 12 could be degraded or lost altogether. Therefore, all soldering steps of the method 100 described below require application of controlled amounts of heat to a localized area of the SMA element 12, in part by controlling the amount of heat at the tip 19T. This allows the flux material 22 to sufficiently wet the SMA element 12 so that the solder material 21 can securely bond to the SMA element 12. Heat is thereafter removed as quickly as possible to prevent heat penetration into the depth of the SMA element 12. In other words, heat is retained locally so the SMA element 12 does not lose its shape memory abilities. In general terms, with specific examples disclosed below, the method 100 uses heat sinks such as conductive clip-on style heat sinks 11 shown in FIG. 1, low liquidus temperature solder material 21, and specific flux materials 22 to minimize the effect on shape memory properties.

The controller 16 of FIG. 1 includes an input device 13 operable for setting a desired soldering temperature. For example, a temperature dial as shown may be rotated to a desired temperature setting, which in the scope of the present method 100 may range from about 375° F. to about 700° F., with soldering temperatures of about 450° F. to about 550° F. being generally suitable, with higher temperatures possibly being used when an oxide layer is present on an outer surface of the SMA element 12 as explained below. Other embodiments of the temperature controller 16 may be digital in design and operation. The setting of a desired soldering temperature via the input device 13 results in the resistive heating of a tip 19T of the soldering pencil 19 to the desired temperature.

Within the scope of the method 100 of FIG. 2 and the automated method 200 of FIG. 3, the flux material 22 may be an active or acidic compound having a low liquidus temperature. As is known in the art, the term "liquidus temperature" refers to the temperature above which a given material is in a completely liquid state. Within the scope of the present disclosure, the term "low liquidus temperature" refers to a temperature of no more than about 500° F. in a particular embodiment. The flux material 22 is used to help remove light layers of surface oxides from the SMA element 12. The use of certain chemicals in the flux material 22, such as tin fluoride (SnF2), may help remove oxide layers. Another example mixture of the flux material 22 is a sufficiently concentrated form of phosphoric acid, e.g., a mixture containing at least 80% phosphoric acid. The SMA elements 12 are tinned with the solder material 21 and the flux material 22 in ends or other areas of the SMA element 12 that will eventually be directly soldered to the component 14.

The solder material 21 used in the methods 100 and 200 may be a suitable non-leaded solder material whenever oxide layers are not present on the surfaces of the SMA element 12, or are present at such diminished levels as to not unduly interfere with direct bonding to the component 14. A leaded and flux cored solder material 21, e.g., containing elemental tin and fluoride, may be selectively used when oxide layers are present at sufficiently high levels relative to a calibrated threshold. When a leaded flux cored form of the solder material 21 is used, a higher relative soldering temperature may be selected via the temperature input device 13, e.g., about 600° F. to 700° F. To minimize the need for leaded solder, the methods 100 and 200 could include the removal of oxide layers from the SMA element 12 in a separate preparation phase, such as via abrasion or the use of an electrochemical bath, and/or by the use of the flux material 22 having tin and fluoride.

With respect to example embodiments of the solder material 21, a tin-based mixture may be used. For instance, a mixture of at least 85% elemental tin (Sn) is suitable in some embodiments. Within the scope of this particular example, a material mixture in the range of about 85% to 96.5% Sn may be used, with the remainder of the mixture being a suitable material such as elemental zinc (Zn), silver (Ag), or antimony (Sb). Within the stated ranges, effective example mixtures may include a mixture of 95% Sn and 5% Sb, i.e., Sn95Sb5, Sn96.5Ag3.5, Sn91Zn9, and Sn85Zn15. In other example embodiments, zinc chloride or zinc fluoride may be used, particularly when surface oxides are present. Those of ordinary skill in the art will appreciate that various other solder materials 21 may be envisioned having a threshold low liquidus temperature of no more than 500° F. within the intended inventive scope, including but not limited to Sn 95.5Cu4Ag0.5, Sn90Zn7Cu3,Pb70Sn30 to Pb55Sn45, Sn50Pb50, Sn50Pb48.5Cu1.5, Sn60Pb40 to Sn95Pb5, Sn60Pb38Cu2, Sn60Pb39Cu1, Sn63Pb37P0.0015-0.04, Sn62Pb37Cu1, Pb80Sn18Ag2, Sn43Pb43Bi14, Sn46Pb46Bi8, Bi52Pb32Sn16, Bi46Sn34Pb20, Sn62Pb36Ag2, Sn62.5Pb3Ag2.5, In97Ag3, In90Ag10, In75Pb25, In70Pb30, In60Pb40, In50Pb50, In50Sn50, In70Sn15Pb9.6Cd5.4, Pb75In25, Sn70Pb18In12, Sn37.5Pb37.5In25, Pb54Sn45Ag1, Sn61Pb36Ag3, Sn56Pb39Ag5, Sn98Ag2, Sn65Ag25Sb10, Sn96.5Ag3.0Cu0.5, Sn95.8Ag3.5Cu0.7, Sn95.6Ag3.5Cu0.9, Sn95.5Ag3.8Cu0.7, Sn95.25Ag3.8Cu0.7Sb0.25, Sn95.5Ag3.9Cu0.6, Sn95.5Ag4Cu0.5, and Sn96.5Ag3.5.

The soldering temperature may be selected depending on the nature of the SMA element 12 and the presence or absence of layers of surface oxides. Generally, the soldering temperature will be in the range of between about 450° F. and 700° F., i.e., sufficiently higher than the low liquidus temperature of the soldering material 21. Higher temperatures within the example range may be used for oxide-coated SMA elements 12, with a lower temperature being more desirable for SMA elements 12 lacking an oxide layer, as well as for minimally impacting the shape-memory properties of the SMA element 12. Because soldering temperature will exceed the melting point of the solder material 21, pure tin will generally be soldered at temperatures above 450° F. Adding 3.5% elemental silver, for instance, will tend to reduce this temperature to about 430° F.

Referring to FIG. 2, the method 100 in an example embodiment begins with step S102, wherein the SMA element 12 is first cut to a desired length and then evaluated for the presence of oxide surface layer or film. For instance, the SMA element 12 may be viewed under a high-power microscope or subjected to other testing or inspection techniques that can reveal oxide layers on the outer surfaces of the SMA element 12. The method 100 then proceeds to step S104.

At step S104, the levels of any oxides detected at step S102 may be compared to a calibrated threshold. The method 100 proceeds to step S107 when detected oxide levels are below the calibrated threshold, and to step S105 or step S106 when the detected oxide levels exceed the calibrated threshold. Specifically, step S105 may be executed in a process in which the oxide layers are separately removed as part of the method 100 before direct soldering, while step S106 may be executed when direct soldering of oxide-containing SMA elements 12 is desired.

At optional step S105, the layers of oxides may be gently removed from the surface of the SMA element 12, such as by chemical or acid etching, via gentle abrasion, or other suitable processing steps. For instance, the SMA element 12 may be submersed in an acid oxide-removal bath for a calibrated duration suitable for removing the oxide layers, followed by a thorough rinsing of the SMA element 12 with a bath of clean liquid water or other suitable cleaning solution. In a possible embodiment, an oxide-coated SMA element 12 may be bathed in a mixture of hydrofluoric acid (HF) and nitric acid (HNO3). One such mixture that may be used is a mixture of 5% concentrated HF, i.e., at least 48% HF, and 15% concentrated HNO3, i.e., at least 70% HNO3. Step S105 may also or alternatively include manually abrading the surface of the SMA element 12 with fine-grit sandpaper or other abrasive material to gently remove the oxide film without abrading the underlying surface of the SMA element 12. The method 100 proceeds to step S107 after the oxide layers have been removed below the level of the threshold applied at step S104.

Step S106 includes setting the soldering temperature of the controller 16 of FIG. 1 to a threshold temperature suitable for soldering oxide-coated SMA element 12. The soldering temperature may exceed 600° F. when, as noted below, flux cored solder wire or a leaded solder material 21 is used. Examples of suitable flux cored solder wire include a mixture of about 70% to 80% lead (Pb), 10% to 20% tin (Sn), and 1% to 5% silver (Ag), ALU-SOL 45D, or other suitable lead-based mixtures. Depending on the configuration of the controller 16 and the temperature input device 13, step S106 may require rotating a dial or selecting a digital setting via a keypad. At each step of the method 100, the amount of heat penetrating into a depth of the SMA element 12 is carefully controlled, i.e., via the clip-on style heat sinks 11 and the use of the specific materials and oxide removal processes disclosed herein, especially while tinning and directly soldering the SMA element. This is done to protect shape memory abilities of the SMA element. The method 100 then proceeds to step S108.

Step S107 includes setting the temperature of the controller 16 to a threshold temperature level suitable for soldering relatively clean, oxide-free SMA elements 12. Execution of step S107 is predicated on a decision at step S104 that detected oxide levels are sufficiently low for proceeding with direct soldering with a lead-free solder material 21, for instance KAPP ZAPP 3.5, or removal of any oxide layers at step S105 to reach such sufficiently low oxide levels. Soldering temperatures may be about 450° F. to 550° F. in step S107, with the temperature set as set forth in step S106 above. The method 100 then proceeds to step S109.

At step S108, solder material 21 may be applied to the SMA element 12. A leaded flux-core version of the solder material 21 may be used for this purpose, for instance containing about 70% elemental lead by weight. The method 100 then proceeds to step S110.

At step S109, an end of the SMA element 12 is tinned with the flux material 22, which is a cored flux material 22 in this instance, and solder material 21 such that the SMA element 12 is coated with sufficiently coated with solder material 21. The tip 19T of the soldering pencil 19 may be cleaned as necessary with the tip-tinning material 24. As is known in the art, tinning is the process of applying flux material 22 and solder material 21 to an end of the SMA element 12 so as to ensure a bond of sufficient integrity is formed between the solder material 22 and the SMA element 12 prior to attaching the SMA element 12 to the component 14. The method 100 then proceeds to step S111.

Step S110 includes cleaning the tip 19T with the tip-tinning material 24, which in this instance should be lead-free. An example of a suitable lead-free tip-tinning material 24 includes a mixture of tin, ammonium phosphate, and diammonium phosphate. The method 100 then proceeds to step S111.

Step S111 includes dipping an end of the SMA element 12 that was previously tinned into the solder material 21, with the composition of the solder material 21 depending on whether or not oxide layers were present at step S102 and not removed at step S105. That is, when oxides are detected, a leaded, flux-cored version of the solder material 21 may be used to help remove the oxide and tin the SMA element 12. When oxides are not detected, the solder material 21 may be lead-free.

Step S111 may also include holding the tinned end with the clip-on style heat sinks 11. For instance, alligator clips may act as a wire holder for the SMA element 12, but also serves as a suitable heat sink, further protecting the shape memory effect of the SMA element 12. The tip 19T of the soldering pencil 19 is coated with soldering material 21 of the types noted above so that a small pool of molten solder is present on the tip 19T. The solder pool on the tip 19T is then touched to the SMA element 12 where flux material 21 coats the SMA element 12, running the SMA element 12 through the molten pool sufficiently to tin the SMA element 12. The method 100 then proceeds to step S113.

Step S113 includes tinning, with the tip-tinning material 24 of FIG. 1, any contact surfaces of the component 14 to which the SMA element 12 will be soldered. By way of example, step S113 may include tinning a contact pad 14C of the component 14a shown in FIG. 1. The method 100 then proceeds to step S115.

At step S115, the soldering pencil 19 is held against the contact pad 14C of the component 14 while a small bead of solder material 21 is applied to the contact pad 14C. The clean SMA element 12 is moved into the molten pool while the solder material 21 remains molten. The soldering pencil 19 is removed once the SMA element 12 is properly positioned. The SMA element 12 is held in place until the solder material 21 eventually cools, usually only a few seconds.

The heat sink 11 can be released. The method 100 repeats with each solder joint that is formed.

Other embodiments of the method 100 of FIG. 2 may be envisioned by one of ordinary skill in the art. For instance, the method 200 of FIG. 3 may include an automated or semi-automated wave soldering process in which the SMA element 12 is first subjected to a series of baths at step 202. In an example embodiment, a first bath of acid, in a step analogous to step S105 of FIG. 2, may be used to remove the oxide layers, while a second bath of clean water removes any acid residue. Additional baths may be used to apply flux material 22 to coat the end of the SMA element 12 and dip the coated end of the SMA element 12 into the solder material 21.

At step 204, the tinned end of the SMA element 12 may be placed in contact with a previously-tinned contact pad 14C of the component 14 and heated via a heat gun, oven, or other heating source to melt the solder material 21. At step 206, the SMA element 12 and tinned contact pad 14C could be pressed together in a clamp or press and allowed to cool. Alternatively, the SMA element 12 may be placed in a pick-and-place machine of the type known in the art and temporarily adhered to the contact pad 14C.

At step 208, the SMA element 12 and component 14 can be sent through another series of baths of flux material 22, solder material 21, and an appropriate cleaner to remove any residual flux material 22. Other processes may be envisioned within the scope of the disclosure using the specific materials and steps outlined above, e.g., having the machine apply a mixture of the solder material 21 and flux material 22 to the contact pad 14C, then send the assembly through an oven to melt the solder material 21. The component 14 can thereafter be sent through a cleaning bath to remove excess flux material 22, with the composition of the cleaning bath depending on the configuration of the component 14.

Advantages of the methods 100 and 200 disclosed above include the maintenance and consistency of application of the shape memory properties of the SMA element 12. By eliminating crimping of end connections or crimps to the SMA element 12 in favor of directly soldering the SMA element 12 to the component 14, the number of applications suitable for inclusion of SMA elements 12 may be increased. The methods 100 and 200 may also lead to assemblies having improved heat transfer characteristics. Moreover, the time and expense associated with crimping end connections to the ends of the SMA element 12 are eliminated. Stronger end attachments are made possible, for instance by allowing the SMA element 12 to attach directly to a control circuit board or other component 14. These and other benefits will be apparent to one of ordinary skill in the art in view of this disclosure.

While the best modes for carrying out the disclosure have been described in detail, those familiar with the art to which this disclosure relates will recognize various alternative designs and embodiments for practicing the disclosure within the scope of the appended claims.

The invention claimed is:

1. A method of soldering a shape memory alloy (SMA) element to a component, the method comprising:
   tinning an end of the SMA element with a solder material and a predetermined flux material, wherein the flux material contains concentrated phosphoric acid or tin fluoride, and wherein the solder material has a liquidus temperature that does not exceed 500° F.;
   positioning the tinned end of the SMA element with respect to a surface of the component;
   directly soldering the tinned end of the SMA element to the surface of the component using the solder material without crimping of the SMA element or using intervening structure between the SMA element and the component; and
   controlling an amount of heat penetrating into a depth of the SMA element by attaching clip-on heat sinks to the SMA element such that the heat is locally retained and does not penetrate sufficiently into the depth of SMA element to cause shape memory abilities of the SMA element to be lost while tinning and directly soldering the SMA element.

2. The method of claim 1, wherein the predetermined flux material contains the concentrated phosphoric acid of at least 80% phosphoric acid by weight.

3. The method of claim 1, further comprising: detecting an oxide layer on the SMA element and using a leaded solder material as the solder material in response to the detected oxide layer.

4. The method of claim 3, wherein the leaded solder material is at least 70% elemental lead by weight.

5. The method of claim 1, further comprising: detecting an absence of an oxide layer on the SMA element, and using a lead-free solder material as the solder material in response to the detected absence of the oxide layer.

6. The method of claim 1, wherein the predetermined flux material contains the tin fluoride.

7. The method of claim 1, further comprising: submersing the SMA element in an acid bath, prior to tinning the end of the SMA element, for a calibrated duration sufficient for removing an oxide layer from the SMA element.

8. The method of claim 7, wherein submersing the SMA element in an acid bath includes submersing the SMA element in a mixture of hydrofluoric acid and nitric acid.

9. The method of claim 1, wherein the solder material contains elemental tin and elemental silver.

10. The method of claim 1, wherein the component is a contact pad of a printed circuit board assembly.

11. The method of claim 1, wherein the SMA element is an SMA wire constructed of nickel titanium.

12. A method of soldering a nickel titanium (NiTi) shape memory alloy (SMA) wire to a component, the method comprising:
   submersing the NiTi SMA wire in an acid bath for a calibrated duration sufficient to remove an oxide layer from the NiTi SMA wire, thereby producing a clean SMA wire;
   tinning an end of the clean NiTi SMA wire with a non-leaded solder material and a flux material;
   positioning the tinned end of the clean NiTi SMA wire with respect to a surface of the component;
   directly soldering the tinned end of the clean NiTi SMA wire to the surface of the component using the solder material without crimping of the NiTi SMA wire or using intervening structure between the NiTi SMA wire and the component, wherein the solder material has a liquidus temperature that does not exceed 500° F.; and
   controlling an amount of heat penetrating into a depth of the NiTi SMA wire by attaching clip-on heat sinks to the NiTi SMA wire such that the heat is locally retained and does not penetrate sufficiently into the depth of NiTi SMA wire to cause shape memory abilities of the NiTi SMA wire to be lost while tinning and directly soldering the NiTi SMA wire.

13. The method of claim 12, wherein the flux material contains at least 80% phosphoric acid by weight.

14. The method of claim 12, wherein the solder material contains at least 15% elemental tin by weight.

15. The method of claim 14, wherein the solder material is 96.5% elemental tin and 3.5% elemental silver.

16. The method of claim 12, wherein submersing the SMA wire in an acid bath includes submersing the SMA wire in a concentrated mixture of hydrofluoric acid and nitric acid.

17. The method of claim 12, wherein the surface of the component is a contact pad of a printed circuit board assembly.

18. A method of soldering a nickel titanium (NiTi) shape memory alloy (SMA) wire to a contact pad of a printed circuit board, the method comprising:

removing an oxide layer from the NiTi SMA wire using a concentrated mixture of hydrofluoric and nitric acid;

tinning an end of the NiTi SMA wire with a flux material containing at least 80% phosphoric acid by weight;

directly soldering the tinned end of the NiTi SMA wire to the contact pad of the printed circuit board without crimping of the NiTi SMA wire or using intervening structure between the NiTi SMA wire and the printed circuit board using a non-leaded solder material having a liquidus temperature that does not exceed 500° F.; and controlling an amount of heat penetrating into a depth of the NiTi SMA wire by attaching clip-on heat sinks to the NiTi SMA wire such that the heat is locally retained and does not penetrate sufficiently into the depth of NiTi SMA wire to cause shape memory abilities of the NiTi SMA wire to be lost while tinning and directly soldering the NiTi SMA wire.

19. The method of claim 18, wherein the non-leaded solder material is 96.5% elemental tin and 3.5% elemental silver by weight.

* * * * *